United States Patent [19]

Loro

[11] 3,781,611

[45] Dec. 25, 1973

[54] MICROELECTRONIC COMPONENT ARRAY

[75] Inventor: Alberto Loro, Ottawa, Ontario, Canada

[73] Assignee: Microsystems International Limited, Montreal, Quebec, Canada

[22] Filed: Nov. 16, 1972

[21] Appl. No.: 307,148

[30] Foreign Application Priority Data

Oct. 16, 1972 Canada .............................. 153965

[52] U.S. Cl. 317/101 A, 317/101 CC, 317/101 CE, 317/234 N, 317/101 B

[51] Int. Cl. .......................................... H01l 19/00

[58] Field of Search .................. 317/101 CE, 101 A, 317/234 N, 101 B, 101 CC

[56] References Cited

UNITED STATES PATENTS

| | | | |
|---|---|---|---|
| 3,388,301 | 6/1968 | James | 317/101 A |
| 3,312,871 | 4/1967 | Seki et al. | 317/101 CE |
| 3,496,419 | 2/1970 | Sakellakis | 317/101 B |
| 3,597,839 | 8/1971 | Jaccodine | 317/101 A |
| 3,591,839 | 7/1971 | Evans | 317/239 N |

*Primary Examiner*—David Smith, Jr.
*Attorney*—Alfred A. DeLuca

[57] ABSTRACT

A microelectronic component array fabricated upon a substrate having deposited upon its surface a network of intersecting, electrically isolated continuous and discontinuous conductor strips. Chips, supporting devices in integrated-circuit form - for example, diodes, transistors, etc., - are located at various selected ones or all of the intersections, the metallization of such devices further serving to bridge discontinuous strip ends at such intersections.

12 Claims, 9 Drawing Figures

MICROELECTRONIC COMPONENT

This invention relates to microelectronic component arrays.

A microelectronic component array, in the present context typically comprises a substrate having parallel conductor strips thereupon extending in a first direction, a number of electronic components — such as memory elements, diodes, etc. — symmetrically arranged upon the strips, and in electrical contact therewith. The remaining electrodes for the components are located upon their upper surfaces and are interconnected by means of wires or a further series of conductive strips, angularly displaced from the first direction. Thus the array is essentially in two planes - the first plane containing the *x* direction conductors, with the components sandwiched between the conductors at their cross-over points. Various U.S. Pat. Nos. show this type of arrangement; for example, 3,373,406 (Cannon et al.) issued Mar. 12th, 1968; 3,011,156 (MacPherson) issued Nov. 28th, 1961; 2,982,002 (Shockley) issued May 2nd, 1961; 2,994,121 (Shockley) issued Aug. 1st, 1961 and 3,594,728 (Lytollis) issued July 20, 1971.

These prior art techniques suffer from one or more of a variety of disadvantages, including high cost, low reliability, poor repairability, low packing density, high capacitive coupling between the *x* and *y* conductors (crosstalk) and poor thermal dissipation. The present invention seeks to avoid these and other disadvantages by having all of the conductors arranged in a single plane upon a substrate with the *x* conductors continuous and the *y* conductors discontinuous so that they do not contact the *x* conductors at their intersections therewith. The components themselves form conductive bridges across the *x* conductors between opposed ends of *y* conductor strips — thus providing electrical continuity of the *y* conductors — and connections to the *x* conductors are also provided. The invention is particularly suited to the fabrication of crosspoint and other diode arrays, but can also be applied to triode and higher order devices.

The invention will now be described further by way of example only and with reference to the accompanying drawings, in which.

Figure 1:
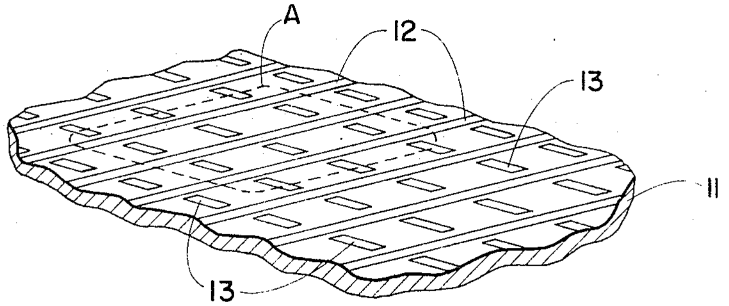
FIG. 1 is a perspective view of a portion of substrate having a conductor pattern thereon according to the present invention.
Figure 2:
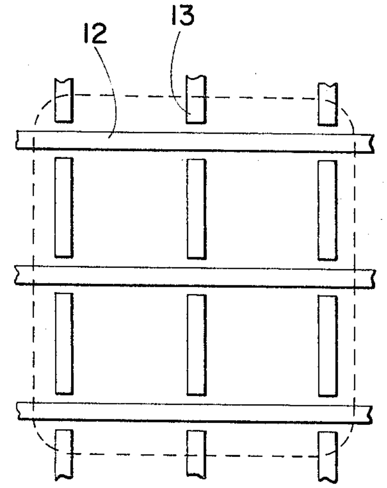
FIG. 2 is a plan view of the area marked by the reference A in FIG. 1.
Figure 2A:
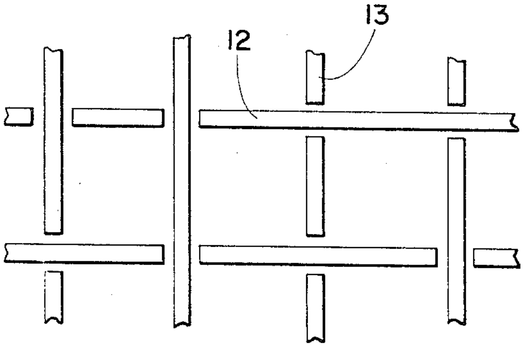
FIG. 2A is a plan view of a further embodiment of the invention.

Referring now to the drawings, and particularly FIGS. 1 and 2 thereof, a substrate portion 11 has a pattern of conductors which may be conventionally formed using thin or thick-film technology. The pattern consists of a number of continuous parallel conductor strips 12 running in the *x* direction and a number of discontinuous parallel conductor strips 13 running the *y* direction. The continuity of the strips 13 is, of course, broken by the strips 12 crossing their paths, thus electrically isolating the strips one from another. Normally, all of the continuous strips will be in one direction and all of the discontinuous strips will be in the other direction. However, this is not necessary to the present invention, and, indeed, the directions of continuity and discontinuity may be quite unsymmetrically arranged, depending upon the requirements for the overall network, as shown in FIG. 2A.

Figure 3:
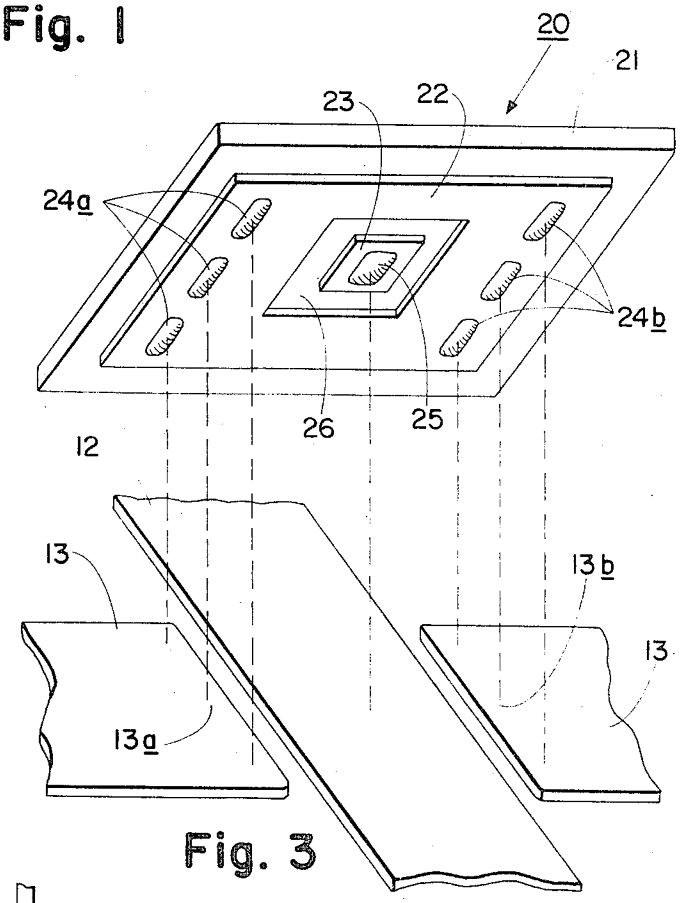
FIG. 3 is an exploded perspective view of a chip supporting a device and underlying conductors fabricated in accordance with one embodiment of the present invention.

FIG. 3 is an exploded view of a chip 20 located at the intersection of two strips 12 and 13. The chip 20 comprises a substrate 21 of, for example, silicon, having thereon a ring of metallization 22. Within the ring, and isolated therefrom, is a metallization pad 23, located approximately centrally of the device. Arranged along opposed sides of the ring 22 are solder bumps **24*a* and 24*b*, disposed so as to register with and contact the opposed ends 13*a* and 13*b* respectively of the strip 13, as shown by the dotted lines in the drawing. A solder bump 25 is also provided on the pad 23, such bump being arranged to register with and contact the strip 12. The ring 22 and pad 23** function as electrodes for an active device formed upon the chip — for example, a diode.

The chip 20 is very simply bonded to the strips 12 and 13 by placement thereof upon the conductors with the solder bumps 24 and 25 in registry with the strips 12 and 13 respectively and then applying heat to one or both of the chip 20 and the supporting substrate 11. Indeed, by use of a template or similar positioning device, a number of chips 20 may be quickly and accurately placed upon the substrate 11 and simultaneously bonded to the conductor strips 12 and 13 using a single shot die attach.

The solder bumps are designed to have a greater total thickness (after bonding) than the conductors, so that the chip only contacts the conductors at the bonding points and is spaced from and forms a bridge over the *x* conductors. Thus continuity between the opposed ends of the *y* conductors is assured in addition to ensuring electrical isolation thereof from the *x* conductors.

The drawings are not to scale and, in practice, the following dimensions may conveniently be employed;

| | |
|---|---|
| Width of strips 12 | 14 mils |
| Width of strips 13 | 25 mils |
| Width of gap between strips 12 and adjacent ends 13*a*, 13*b* | 5 mils |
| Chip dimensions | 25 × 40 mils ( *y* by *x* dimensions) |

Using three bumps per *y* - conductor end, the alignment tolerance in the *x* direction would be about ± 4 mils, and in the *y* direction about ± 10 mils.

Figure 3A:
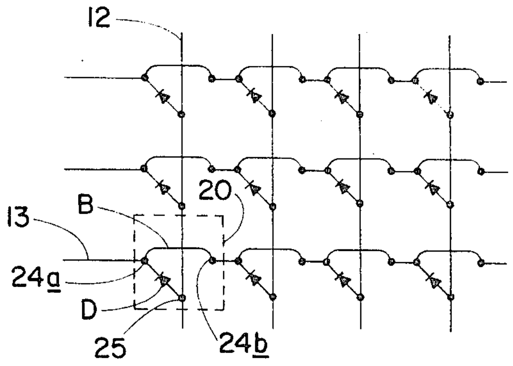
FIG. 3A is a circuit diagram of the structure shown in FIG. 3.

FIG. 3A is a circuit diagram of part of a network including a plurality of chips 20 having diodes D fabricated thereupon. Each interconnect B of FIG. 3A is, of course, formed by the metallization ring 22 of FIG. 3.

Figures 4, 4A, 5, 5A:
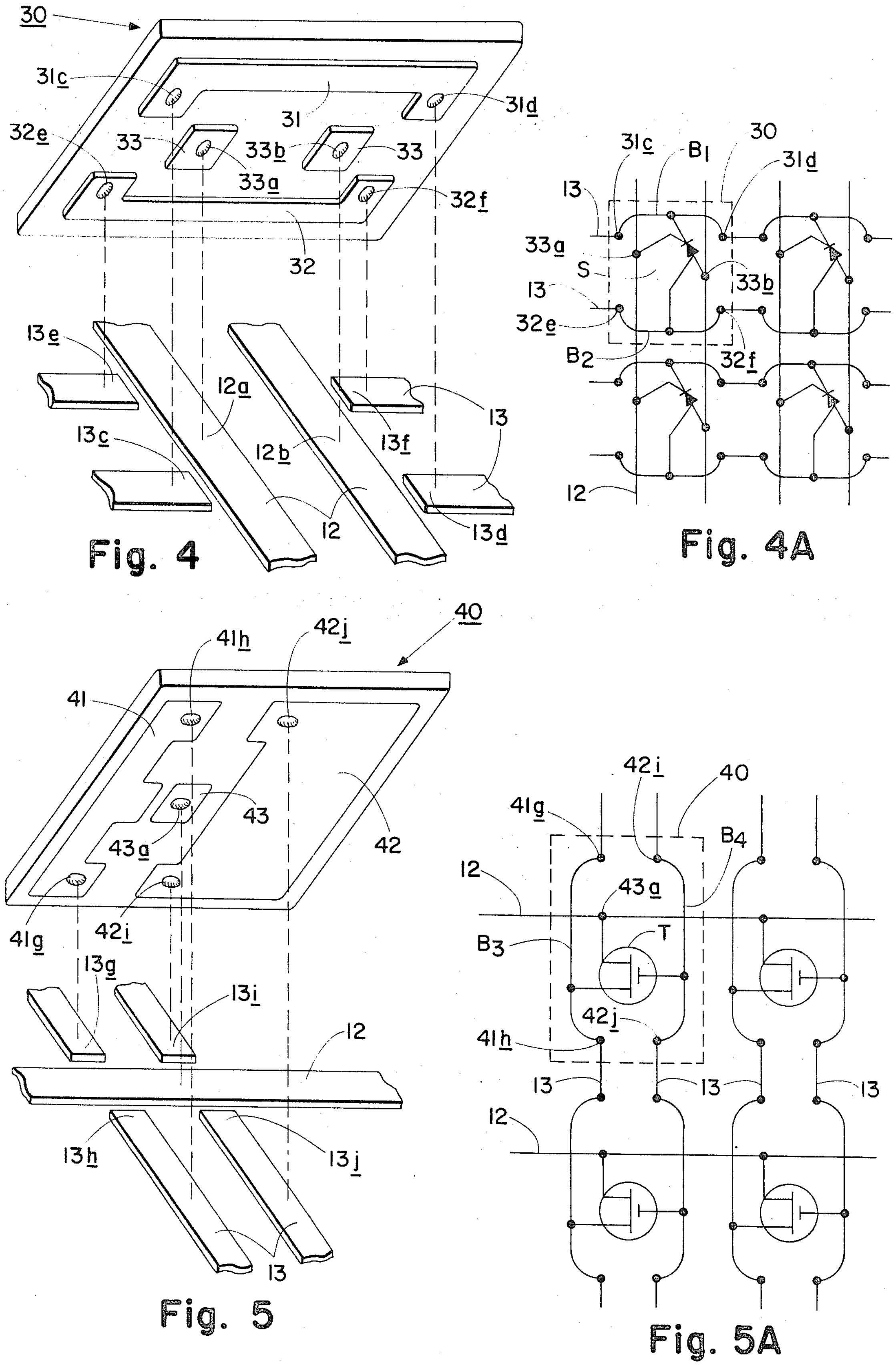
FIG. 4 is an exploded perspective view of a chip supporting a device and underlying conductors fabricated in accordance with a further embodiment of the invention.
FIG. 4A is a circuit diagram of the structure shown in FIG. 4.
FIG. 5 is an exploded view with yet a further embodiment of the invention.
FIG. 5A is a circuit diagram of the structure shown in FIG. 5.

Turning now to FIG. 4, a further embodiment of the invention is shown, wherein a chip 30 having a four-terminal device or circuit thereupon is shown. Now the chip is large enough to space two adjacent conductors 12 and two conductors 13. The chip 30 is provided with two strips of metallization 31 and 32 along opposite sides thereof, each strip terminating in solder bumps at each end thereof. Strip 31 terminates in solder bumps 31*c* and 31*d* and strip 32 terminates in solder bumps 32*e* and 32*f*. As shown by the dotted lines in the drawing, bumps 31*c*, 31*d*, 32*e* and 32*f* are arranged so as to register with and contact strip ends 13*c*, 13*d*, 13*e* and 13*f*, respectively. Metallization pads 33 having solder bumps 33*a* and 33*b* respectively located thereupon are also provided on the chip 30 and arranged so as to register with adjacent strips 12 at locations 12*a* and 12*b* respectively.

Thus, the strips 31 and 32 provide continuity between the strip ends 13*e* and 13*f* and between the strip ends 13*c* and 13*d*, respectively, and - as in the embodiment of FIG. 3 - the chip 30 not only provides the required active device but also continuity of the strips 13. In this case, there is clearly no requirement for strip portions 13 between the strips 12, and the strips 12 can therefore be fabricated as close together as is practicable from the view-point of chip fabrication, crosstalk between adjacent strips, etc.

FIG. 4A is a circuit diagram of part of a network including a plurality of chips 30 having four-layer double-gated switching devices S fabricated thereupon. Each interconnect $B_1$ and $B_2$ of FIG. 4A is formed by the strips 31 and 32 of FIG. 4.

FIG. 5 shows a further embodiment of the invention wherein a three-terminal device or circuit chip 40 is shown above a suitable intersection pattern. The device may be a transistor, silicon-controlled rectifier, etc. The chip metallization comprises two strips 41 and 42 which form respectively the control electrode and anode of the device. Each strip is provided with solder bumps 41*a*, 41*b* and 42*a*, 42*b*, respectively at each end thereof. The cathode of the device is formed by metallization 43, upon which is provided a solder bump 43*a*. Beneath the chip 40 is the intersection pattern formed of strips 12 and 13. In this case, there are two closely spaced parallel strips 13, both of which are interrupted by a continuous strip 12. The opposed strip ends 13*g*, 13*h* and 13*i*, 13*j* respectively align with solder bumps 41*g*, 41*h* and 42*i*, and 42*j* and solder bump 43*a* aligns with the strip 12.

FIG. 5A shows a circuit diagram of part of a network including a plurality of chips 40, having field-effect transistors T fabricated thereupon. Each interconnect $B_3$ and $B_4$ of FIG. 5A is formed by the strips 41 and 42 of FIG. 5.

In the embodiments described, solder bumps have been specified as the connecting medium to the conductor srtrips. However it will be realized that any kind of conventional bonding tabs or bumps — normally used for chip mounting — may be employed. Examples are thermo-compression and ultrasonically bondable bumps, beam-leads and other stress-relieved mounting terminals. Particularly suitable are the terminals described and claimed in my copending U.S. application, Ser. No. 271,150. One type of terminal encompassed by the aforementioned patent application is sold by Microsystems International Limited under the trade mark MILMOUNT and generally comprises a beam terminal which does not extend beyond the bounds of the chip and which is not cantilevered outwardly therefrom. The beam terminal is adherent to the chip at one end of the beam only and to the conductor strip at the other end. Thus the chip is almost "spring-mounted" upon the conductor strips due to the resiliency of the beams, with the obvious attendant advantages of high-shock-resistance and mechanical reliablility.

The only constraints upon the choice of terminals from a technical standpoint which are particular to the present invention are dimensional considerations - i.e., the terminals which are bonded to the *x* conductors must not be large enough to short-circuit the devices by contacting the *y* conductors and vice-versa.

Thus, I have provided a structure which has the advantages of low assembly cost, since a number of pre-tested chips may be mounted upon a single-layer substrate using single shot die attach and connect, high packing density and good thermal dissipation through the conductor strips. When thermo-compression stress-relieved terminals are used on the chip, there are the additional particular advantages of low electrical resistance through the conductors and chips, and - as stated above - high mechanical reliability and shock resistance.

Various alternatives and modificiations to the embodiments disclosed herein will be readily apparent to those skilled in the art without departing from the spirit and scope of the invention as described by the disclosure and defined by the claims appended hereto.

What is claimed is:

1. In combination a substrate member having a surface upon which are deposited a plurality of first spaced parallel conductive strips extending in a first direction and, coplanar therewith, a plurality of second spaced parallel conductive strips extending in a second direction, said first strips intersecting said second strips, one of said first and second strips at each intersection point being continuous and the other of said first and second strips at each said intersection point being discontinuous, the opposed ends of said discontinuous strip being electrically isolated from said continuous strip, a semiconductor chip at each said intersection point said chip having an active semiconductor device and first and second terminal means on said chip the first terminal means on said chip being connected to one electrode of said device and the second terminal means on said chip being connected to another electrode of said device the first terminal means on said chip being further connected to said continuous strip and the second terminal means on said chip being further connected to the opposed ends of said discontinuous strip and interconnecting said opposed ends, said chip being supported at least by said first and second terminal means in spaced relationship with said first and second strips and electrically isolated therefrom except for the aforesaid connections between said terminal means and said strips.

2. The combination of claim 1 wherein said first and second directions are substantially at right angles to one another.

3. The combination of claim 2 wherein said first strips are said continuous strips and said second strips are said discontinuous strips.

4. The combination of claim 3 wherein said semiconductor device is a two-electrode device.

5. The combination of claim 1 wherein each intersection point comprises a pair of parallel spaced discontinuous strips having the continuity thereof interrupted by a pair of parallel, spaced, continuous strips, and said semiconductor device is a four-electrode device having in addition to said first and second terminal means, third and fourth terminal means for said device, said second and fourth terminal means being connected to and interconnecting opposed ends of each respective said discontinuous strip and said first and third terminal means connected to each respective said continuous strip.

6. The combination of claim 1 wherein each intersection point comprises a pair of spaced parallel discontinuous strips having the continuity thereof interrupted by a continuous strip, and said semiconductor device is a three-electrode device having, in addition to said first and second terminal means, third terminal means for said device, said second and third terminal means being connected to and interconnecting opposed ends of each respective said discontinuous strip and said first terminal means connected to said continuous strip.

7. The combination of claim 7 wherein said first and second directions are substantially at right angles to one another.

8. The combination of claim 7 wherein said three-terminal device is a controllable rectifier, said first terminal means being connected to the cathode thereof, said second terminal means being connected to the anode thereof and said third terminal means connected to the control element thereof.

9. The combination of claim 1 wherein said terminal means are solder bumps.

10. The combination of claim 1 wherein said terminal means comprise stress-relieved terminals.

11. The combination of claim 1 wherein said terminal means are beam-leads.

12. The combination of claim 1 wherein each intersection point comprises a pair of continuous spaced parallel strips interrupting the continuity of a discontinuous strip.

* * * * *